US012796294B2

(12) United States Patent
Shin et al.

(10) Patent No.: US 12,796,294 B2

(45) Date of Patent: Nov. 10, 2026

(54) DISPLAY DEVICE

(71) Applicant: LG Display Co., Ltd., Seoul (KR)

(72) Inventors: Youngsub Shin, Goyang-si (KR); Mikyung Lee, Goyang-si (KR); Chaekyung Lim, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 393 days.

(21) Appl. No.: 18/388,500

(22) Filed: Nov. 9, 2023

(65) Prior Publication Data

US 2024/0172538 A1 May 23, 2024

(30) Foreign Application Priority Data

Nov. 23, 2022 (KR) ........................ 10-2022-0158370

(51) Int. Cl.

*H10K 59/80* (2023.01)
*H10K 59/122* (2023.01)
*H10K 59/38* (2023.01)
*H10K 59/40* (2023.01)

(52) U.S. Cl.

CPC ......... *H10K 59/879* (2023.02); *H10K 59/122* (2023.02); *H10K 59/38* (2023.02); *H10K 59/40* (2023.02); *H10K 59/873* (2023.02); *H10K 59/8792* (2023.02)

(58) Field of Classification Search

CPC .... H10K 59/879; H10K 59/40; H10K 59/122; H10K 59/873; H10K 59/38; H10K 59/8792

See application file for complete search history.

(56) References Cited

U.S. PATENT DOCUMENTS

| | | | |
|---|---|---|---|
| 11,487,630 | B2 | 11/2022 | Hwang et al. |
| 2019/0013362 | A1 | 1/2019 | Qi et al. |
| 2021/0066648 | A1 | 3/2021 | Chung et al. |
| 2022/0140283 | A1 | 5/2022 | Kim et al. |

FOREIGN PATENT DOCUMENTS

| | | | |
|---|---|---|---|
| CN | 108258008 | A | 7/2018 |
| KR | 10-2020-0086413 | A | 7/2020 |
| KR | 10-2021-0028296 | A | 3/2021 |

OTHER PUBLICATIONS

Zheng et al., CN 110727368, Jan. 24, 2020 (Year: 2020).*
Li, CN 111146354, May 12, 2020 (Year: 2020).*
Kimura et al., WO 2014203418, Dec. 24, 2014 (Year: 2014).*

* cited by examiner

*Primary Examiner* — Mary Ellen Bowman
(74) *Attorney, Agent, or Firm* — Morgan, Lewis & Bockius LLP

(57) ABSTRACT

A display device capable of reducing reflection of external light is provided. The display device includes a substrate on which a display area and a non-display area are disposed; a light-emitting element disposed in a sub-pixel of the display area; an encapsulation layer covering the light-emitting element; a black matrix disposed on the encapsulation layer; a color filter overlapping the light-emitting element and covering an edge of the black matrix; and a low refractive index layer covering at least a portion of an upper surface of the black matrix and at least a portion of an upper surface of the color filter, wherein the low refractive index layer has a refractive index lower than a refractive index of each of the black matrix and the color filter.

7 Claims, 4 Drawing Sheets

DISPLAY DEVICE

CROSS-REFERENCE TO RELATED APPLICATION

This application claims priority from Korean Patent Application No. 10-2022-0158370 filed on Nov. 23, 2022, in the Korean Intellectual Property Office, and all the benefits accruing therefrom under 35 U.S.C. 119, the contents of which in its entirety are herein incorporated by reference.

BACKGROUND

Technical Field

The present disclosure relates to a display device. More specifically, the present disclosure relates to a display device in which external light reflection may be reduced.

Discussion of the Related Art

Various display devices such as a liquid crystal display device (LCD), a light-emitting display device (LED), and a quantum dot display device are being developed.

The light-emitting display device (LED) is a self-light-emissive display device. Unlike the liquid crystal display device (LCD), the LED does not require a separate light source, and thus may be manufactured in a lightweight and thin manner. Further, the light-emitting display device is advantageous not only in terms of power consumption due to low operation voltage, but also in terms of color rendering, response speed, viewing angle, and contrast ratio (CR) and thus is being studied as a next-generation display device.

In a display panel of the light-emitting display device, external light such as sunlight and light from a lighting device is reflected from exposed various electrodes and lines, and thus the reflected external light lowers visibility and contrast, resulting in poor display quality. For this reason, a polarizer is provided on the display panel of the light-emitting display device to reduce the external light reflection.

However, the presence of the polarizer lowers luminance of the light-emitting display device. Thus, in order to improve the luminance, power consumption should increase. Therefore, the light-emitting display device capable of reducing the external light reflection without using the polarizer is being developed.

Instead of employing the polarizer, a black bank for distinguishing light-emitting areas of sub-pixels from each other in the light-emitting display device is employed, and a black matrix is disposed between color filters, such that the external light reflection of the display panel of the light-emitting display device may be significantly reduced. However, external light reflection from a surface of the black matrix and external light reflection from a surface of the color filter still occur.

SUMMARY

Thus, the inventors of the present disclosure have invented a novel display device in which external light reflection from a black matrix surface and external light reflection from a surface of color filter may be reduced.

Accordingly, embodiments of the present disclosure are directed to a display device that substantially obviates one or more of the problems due to limitations and disadvantages of the related art.

An aspect of the present disclosure is to provide a display device capable of reducing external light reflection to a level similar to that of the display device having the polarizer without including the polarizer.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a display device comprises: a substrate on which a display area and a non-display area are disposed; a light-emitting area disposed in a sub-pixel of the display area; an encapsulation layer covering the light-emitting area; a black matrix disposed on the encapsulation layer; a color filter overlapping the light-emitting area and covering an edge of the black matrix; and a low refractive index layer covering at least a portion of an upper surface of the black matrix and at least a portion of an upper surface of the color filter, wherein the low refractive index layer has a refractive index lower than a refractive index of each of the black matrix and the color filter.

In another aspect, a display device comprises: a substrate on which a display area and a non-display area are disposed; a plurality of light-emitting areas respectively disposed in a plurality of sub-pixels of the display area; an encapsulation layer disposed on the plurality of light-emitting areas; a plurality of color filters respectively overlapping the plurality of light-emitting areas and disposed on the encapsulation layer; a color planarization layer disposed on the plurality of color filters; and a first low refractive index layer disposed between each of the plurality of color filters and the color planarization layer, wherein the first low refractive index layer has a refractive index lower than a refractive index of each of the plurality of color filters and the color planarization layer.

Details of other embodiments are included in the detailed descriptions and drawings.

According to the aspects of the present disclosure, the low refractive index layer may be disposed on the upper surface of the black matrix and the upper surface of the color filter, such that the external light reflection from the black matrix surface and the external light reflection from the color filter surface may be reduced. Accordingly, external light reflection of the display device may be reduced to a level equal to or lower than that of the display device including the polarizer even without the polarizer.

Further, according to the aspects of the present disclosure, the display device may be free of the polarizer such that a manufacturing cost of the display device may be reduced.

Moreover, according to the aspects of the present disclosure, high luminance may be implemented, and thus, power consumption may be reduced, compared to the display device having the polarizer.

It is to be understood that both the foregoing general description and the following detailed description are exemplary and explanatory and are intended to provide further explanation of the inventive concepts as claimed.

BRIEF DESCRIPTION OF DRAWINGS

The accompanying drawings, which are included to provide a further understanding of the disclosure and are incorporated in and constitute a part of this application, illustrate embodiments of the disclosure and together with the description serve to explain various principles.

DETAILED DESCRIPTION

Figure 1:
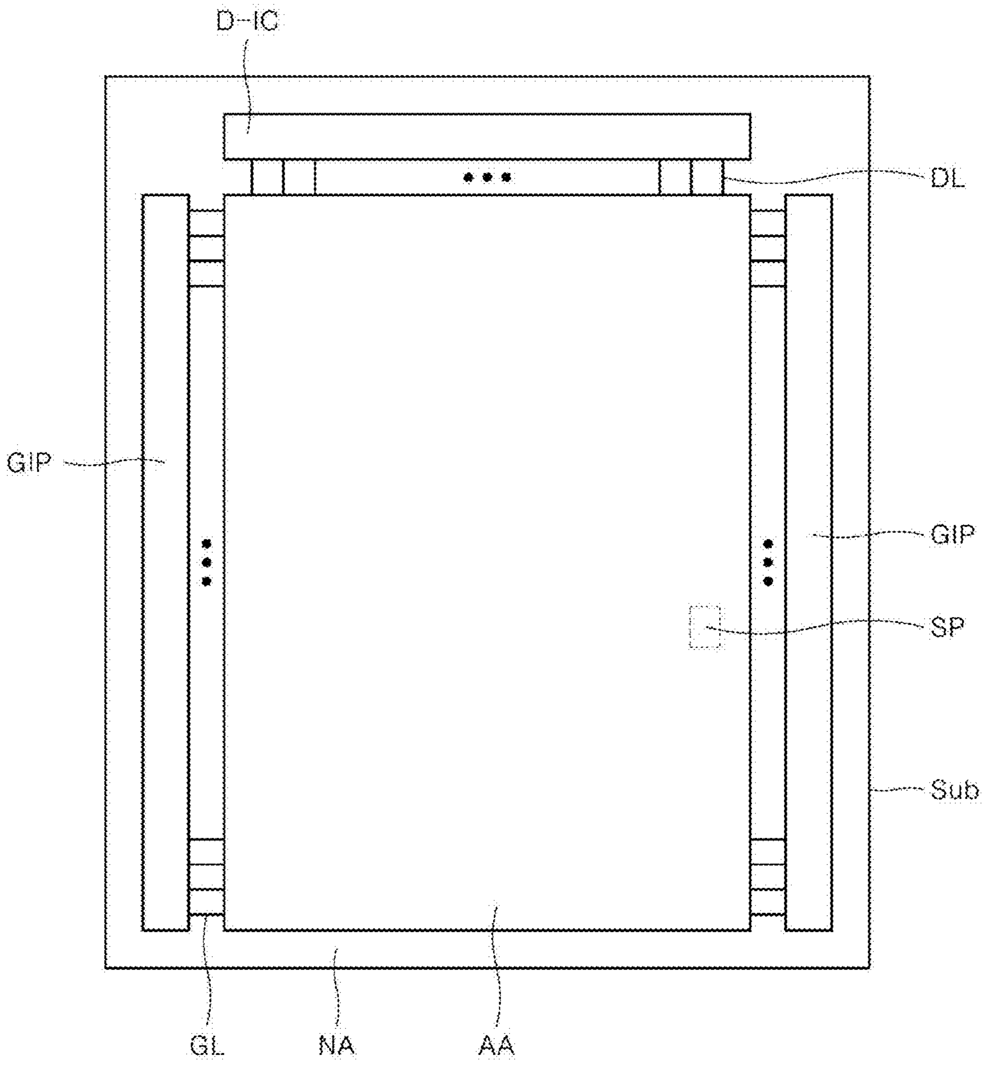
FIG. 1 is a plan view showing a display device according to one embodiment of the present disclosure.

Advantages and features of the present disclosure, and a method of achieving the advantages and features will become apparent with reference to embodiments described later in detail together with the accompanying drawings. However, the present disclosure is not limited to the embodiments as disclosed under, but may be implemented in various different forms. Thus, these embodiments are set forth only to make the present disclosure complete, and to completely inform the scope of the present disclosure to those of ordinary skill in the technical field to which the present disclosure belongs.

For simplicity and clarity of illustration, elements in the drawings are not necessarily drawn to scale. The same reference numbers in different drawings represent the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure. Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

A shape, a size, a ratio, an angle, a number, etc. disclosed in the drawings for illustrating embodiments of the present disclosure are illustrative, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is directed to the purpose of describing particular embodiments only and is not intended to be limiting of the present disclosure. As used herein, the singular constitutes "a" and "an" are intended to include the plural constitutes as well, unless the context clearly indicates otherwise. It will be further understood that the terms "comprise", "comprising", "include", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of associated listed items. Expression such as "at least one of" when preceding a list of elements may modify the entire list of elements and may not modify the individual elements of the list. In interpretation of numerical values, an error or tolerance therein may occur even when there is no explicit description thereof.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to", or "connected to" another element or layer, it may be directly on, connected to, or connected to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after", "subsequent to", "before", etc., another event may occur therebetween unless "directly after", "directly subsequent" or "directly before" is indicated.

When a certain embodiment may be implemented differently, a function or an operation specified in a specific block may occur in a different order from an order specified in a flowchart. For example, two blocks in succession may be actually performed substantially concurrently, or the two blocks may be performed in a reverse order depending on a function or operation involved.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The features of the various embodiments of the present disclosure may be partially or entirely combined with each other, and may be technically associated with each other or operate with each other. The embodiments may be implemented independently of each other and may be implemented together in an association relationship.

In interpreting a numerical value, the value is interpreted as including an error range unless there is separate explicit description thereof.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, "embodiments," "examples," "aspects, and the like should not be construed such that any aspect or design as described is superior to or advantageous over other aspects or designs.

Further, the term "or" means "inclusive or" rather than "exclusive or". That is, unless otherwise stated or clear from the context, the expression that 'x uses a or b' means any one of natural inclusive permutations.

The terms used in the description below have been selected as being general and universal in the related technical field. However, there may be other terms than the terms depending on the development and/or change of technology, convention, preference of technicians, etc. Therefore, the terms used in the description below should not be understood as limiting technical ideas, but should be understood as examples of the terms for illustrating embodiments.

Further, in a specific case, a term may be arbitrarily selected by the applicant, and in this case, the detailed meaning thereof will be described in a corresponding description section. Therefore, the terms used in the description below should be understood based on not simply the name of the terms, but the meaning of the terms and the contents throughout the Detailed Descriptions.

Hereinafter, a display device according to an embodiment of the present disclosure will be described in detail with reference to the accompanying drawings.

FIG. 1 is a plan view illustrating a display device according to an embodiment of the present disclosure.

The display device includes a substrate Sub, and a display area AA and a non-display area NA around the display area AA disposed on the substrate. A gate driver GIP is disposed on the substrate Sub and in the non-display area NA. A data driver D-IC is disposed on the substrate Sub and in the non-display area NA.

The display area AA on the substrate Sub is an area where a plurality of sub-pixels SP are arranged and an image is displayed. Each sub-pixel SP may emit, for example, red, green, blue, or white light. However, the present disclosure is not limited thereto. A light-emitting element for displaying an image and a pixel circuit for driving the light-emitting element may be disposed in each sub-pixel SP. The pixel circuit may include a driving thin-film transistor, at least one switching thin-film transistor, and at least one capacitor. The light-emitting element may be, for example, a light-emitting diode.

The non-display area NA on the substrate Sub is an area where an image is not displayed, and is an area where drivers for driving a plurality of sub-pixels SP disposed in the display area AA, and various lines are disposed. The gate driver GIP, the data driver D-IC, gate lines GL, and data lines DL may be disposed in the non-display area NA.

The gate driver GIP is controlled according to a plurality of gate control signals supplied from a timing controller, and individually drives the gate lines GL. The data driver D-IC is controlled according to a data control signal supplied from the timing controller, converts digital data supplied from the timing controller into an analog data signal, and supplies the analog data signal to each of the data lines DL. The data driver D-IC may supply a reference voltage to a reference line.

As shown in FIG. 1, the non-display area NA may be an area surrounding an edge of the display area AA. In FIG. 1, the non-display area NA is shown as surrounding a rectangular display area AA. However, the shape of the display area AA and the shape and the position of the non-display area NA adjacent to the display area AA are not limited to an example as shown in FIG. 1. Each of the display area AA and the non-display area NA may have a form suitable for a design of an electronic device on which the display device is mounted. An example of the shape of the display area AA may be pentagonal, hexagonal, circular, elliptical, etc. However, the present disclosure is not limited thereto.

Figure 2:
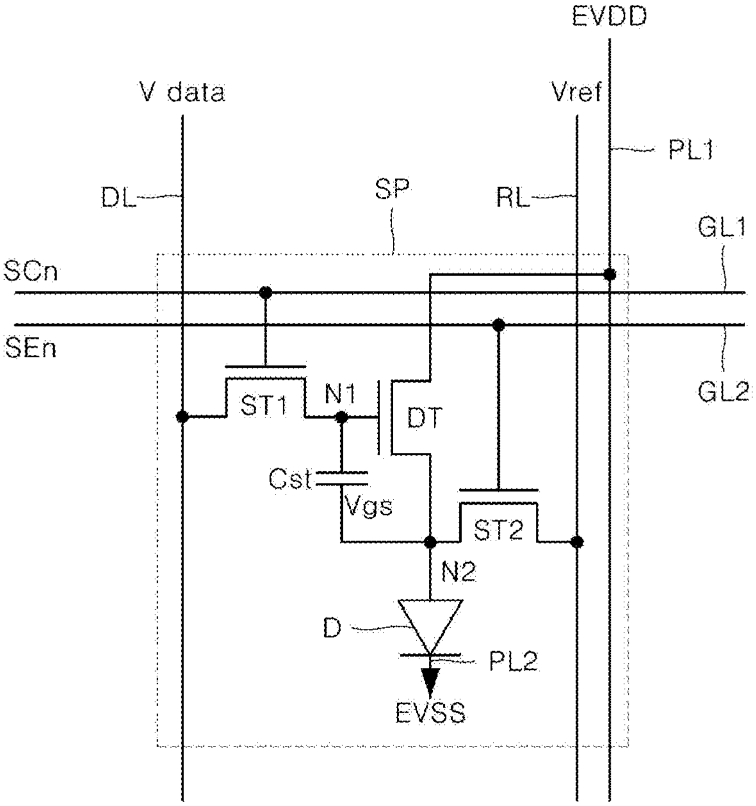
FIG. 2 is an equivalent circuit diagram illustrating one sub-pixel in a display device according to one embodiment of the present disclosure.

FIG. 2 is an equivalent circuit diagram illustrating one sub-pixel in a display device according to an embodiment of the present disclosure.

Referring to FIG. 2, each sub-pixel SP includes a light-emitting element D connected to a high-potential voltage line PL1 supplying a high potential driving voltage (a first driving voltage) EVDD and a low potential voltage line PL2 supplying a low-potential driving voltage (a second driving voltage) EVSS; and a pixel circuit including at least a first switching thin-film transistor ST1, a second switching thin-film transistor ST2, a driving thin-film transistor DT and a storage capacitor Cst in order to independently drive the light-emitting element D. The equivalent circuit diagram as shown in FIG. 2 is illustrative, and the number of switching thin-film transistors may be changed according to a design of an internal compensation circuit for compensating for a difference between operation characteristics of the sub-pixels SP. The pixel circuit may have various configurations such as 3T1C (3 thin-film transistors, 1 capacitor), 4T1C (4 thin-film transistors, 1 capacitor), 5T1C (5 thin-film transistors, 1 capacitor), 6T1C (6 thin-film transistors, 1 capacitor), 7T1C (7 thin-film transistors, 1 capacitor), etc.

The light-emitting element D includes an anode connected to a source node N2 of the driving thin-film transistor DT, a cathode connected to the low potential voltage line PL2, and an organic light-emissive layer disposed between the anode and the cathode. The anode may be individually disposed in each sub-pixel SP, while the cathode may be a common electrode shared by all sub-pixels SP.

The first switching thin-film transistor ST1 operates based on a scan pulse SCn supplied from the gate driver GIP to one gate line GL1, and supplies a data voltage Vdata supplied from the data driver D-IC to the data line DL to a gate node N1 of the driving thin-film transistor DT.

The second switching thin-film transistor ST2 operates based on a sense pulse SEn supplied from the gate driver GIP to another gate line GL2, and supplies a reference voltage Vref supplied from the data driver D-IC to a reference line RL to the source node N2 of the driving thin-film transistor DT. In one example, in a sensing mode, the second switching thin-film transistor ST2 may provide a current based on the characteristics of the driving thin-film transistor DT or the characteristics of the light-emitting element D to the reference line RL.

The storage capacitor Cst connected to and disposed between the gate node N1 and the source node N2 of the driving thin-film transistor DT charges therein a difference between the data voltage Vdata and the reference voltage Vref supplied to the gate node N1 and the source node N2 via the first and second switching thin-film transistors ST1 and ST2, respectively, as a driving voltage Vgs of the driving thin-film transistor DT. The storage capacitor Cst maintains the charged driving voltage Vgs during a light emission period in which the first and second switching thin-film transistors ST1 and ST2 are turned off.

The driving thin-film transistor DT controls current supplied from the high-potential voltage line PL1 based on the driving voltage Vgs supplied from the storage capacitor Cst, and supplies driving current determined based on the driving voltage Vgs to the light-emitting element D such that the light-emitting element D emits light.

Figure 3:
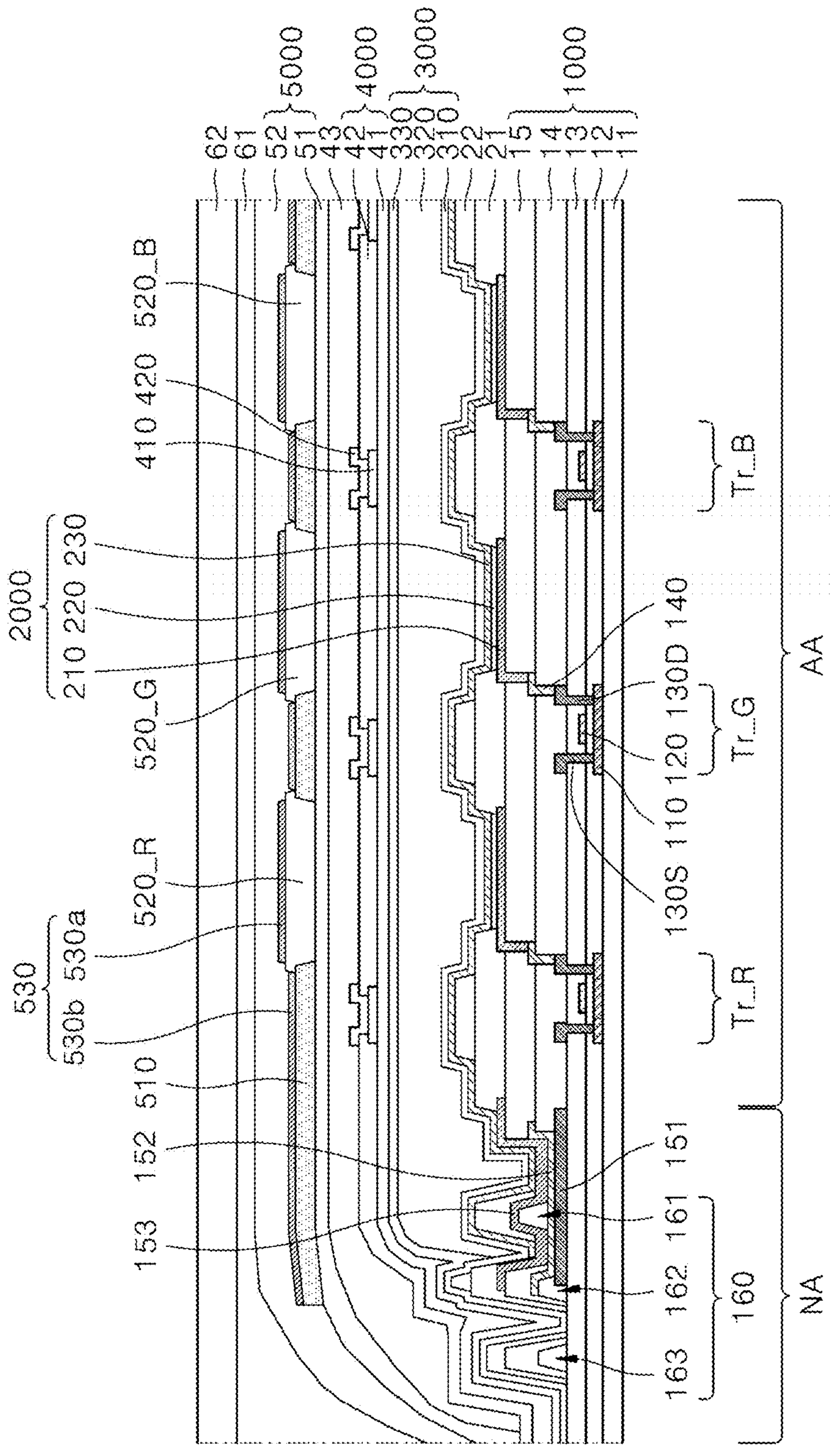
FIG. 3 and FIG. 4 are cross-sectional views of display devices according to two different embodiments of the present disclosure, respectively.

FIG. 3 is a cross-sectional view of a display device according to one embodiment of the present disclosure.

Referring to FIG. 3, the display device according to one embodiment of the present disclosure may include a transistor portion 1000, a light-emitting element 2000, an encapsulation layer 3000, a touch portion 4000, and a color filter portion 5000. However, the present disclosure is not limited thereto.

A substrate 11 of the display device according to an embodiment of the present disclosure may include a first substrate and a second substrate, and an intermediate layer between the first substrate and the second substrate. Each of the first substrate and the second substrate may be made of at least one of polyimide, polyethersulfone, polyethylene terephthalate, and polycarbonate. Embodiments of the present disclosure are not limited thereto. When the substrate is made of a plastic material, moisture may invade into the substrate and then into the thin-film transistor or the light-emitting layer, which may deteriorate the performance of the display device. The display device according to an embodiment of the present disclosure may be composed of the two substrates, that is, the first substrate and the second substrate made of a plastic material in order to prevent performance degradation of the display device due to the moisture permeation. Further, the intermediate layer made of an inorganic material may be disposed between the first substrate and the second substrate so as to prevent moisture from penetrating the substrate, thereby may improve the performance reliability of the product. The intermediate layer may be composed of an inorganic film. For example, the intermediate layer may be composed of a single layer of silicon nitride (SiNx) or silicon oxide (SiOx) or a stack of multiple layers made of thereof. However, the present disclosure is not limited thereto.

The display device may include a plurality of areas disposed on the substrate 11. In the present disclosure, the plurality of areas include a display area AA and a non-display area NA adjacent to the display area AA. However, embodiments of the present disclosure are not limited thereto.

A buffer layer composed of a single layer made of silicon nitride (SiNx) or silicon oxide (SiOx) or a stack of multiple layers made thereof may be disposed on one surface of the substrate 11 and in the display area AA and the non-display area NA. The buffer layer may improve adhesion between layers formed on the buffer layer and the substrate 11, and may perform a role of blocking various types of defect-causing factors, such as alkali components flowing out from the substrate 11. Further, the buffer layer may retard diffusion of moisture or oxygen that has invaded into the substrate 11. The buffer layer may be omitted based on a type and a material of the substrate, a structure and a type of the thin-film transistor, and the like.

Transistors constituting the transistor portion 1000 may be formed on the substrate 11 and the buffer layer and in the display area AA and the non-display area NA. The transistor in the display area AA may include a switching transistor or a driving transistor for driving the sub-pixel, while the transistor in the non-display area NA may include a light-emission transistor or a gate driver transistor for driving the gate driver.

In the display area AA according to FIG. 3, a red driving transistor Tr_R, a green driving transistor Tr_G, and a blue driving transistor Tr_B of red (R), green (G), and blue (B) sub-pixels, respectively, are disposed.

Each of the red driving transistor Tr_R, the green driving transistor Tr_G, and the blue driving transistor Tr_B may include a semiconductor layer 110, a gate electrode 120, a source electrode 130S, and a drain electrode 130D disposed on the substrate 11 or the buffer layer. The semiconductor layer 110 may be made of LTPS (Low Temperature Polycrystalline Silicon) or a metal oxide semiconductor. For example, the metal oxide semiconductor may be made of one of IGZO (Indium-gallium-zinc-oxide), IZO (Indium-zinc-oxide), IGTO (Indium-gallium-tin-oxide), and IGO (Indium-gallium-oxide). However, the present disclosure is not limited thereto.

A gate insulating film 12 may be disposed on the semiconductor layer 110. Since the gate insulating film 12 is disposed between the semiconductor layer 110 and the gate electrode 120, the gate insulating film 12 may insulate the semiconductor layer 110 and the gate electrode 120 from each other. The gate insulating film 12 may be made of an insulating inorganic material such as silicon nitride (SiNx) or silicon oxide (SiOx), or an insulating organic material. However, embodiments of the present disclosure are not limited thereto.

A gate electrode 120 may be disposed so as to overlap the semiconductor layer 110.

The gate electrode 120 may be composed of a single layer or a stack of multiple layers made of any one of silver (Ag), molybdenum (Mo), copper (Cu), titanium (Ti), aluminum (Al), chromium (Cr), nickel (Ni), neodymium (Nd), tungsten (W), and gold Au or an alloy thereof. However, the present disclosure is not limited thereto.

An interlayer insulating film 13 may be disposed on the gate electrode 120. The interlayer insulating film 13 may be made of an insulating inorganic material such as silicon nitride (SiNx) or silicon oxide (SiOx), or may be made of an insulating organic material. However, embodiments of the present disclosure are not limited thereto.

A source electrode 130S and a drain electrode 130D connected to the semiconductor layer 110 may be disposed on the interlayer insulating film 13.

The source electrode 130S and the drain electrode 130D may be formed in the same process, and may be made of at least one of silver (Ag), molybdenum (Mo), copper (Cu), titanium (Ti), aluminum (Al), chromium (Cr), nickel (Ni), neodymium (Nd), tungsten (W), and gold (Au). Alternatively, each of the source electrode 130S and the drain electrode 130D may be composed of at least two or more layers including a first layer made of titanium (Ti), and a second layer made of at least one of molybdenum (Mo), copper (Cu), aluminum (Al), silver (Ag), chromium (Cr), gold (Au), neodymium (Nd), and nickel (Ni). However, the present disclosure is not limited thereto.

A first line 151 may be formed in the non-display area NA using the same process as a process of forming the source electrode 130S and the drain electrode 130D.

The first line 151 may transfer the low-potential voltage EVSS output from the flexible PCB (printed circuit board) (FPCB) to a cathode electrode 230.

A first planarization layer 14 may be disposed on the source electrode 130S and the drain electrode 130D, and a portion of the first line 151. The first planarization layer 14 may be composed of an inorganic insulating film made of, for example, silicon nitride (SiNx) or silicon oxide (SiOx), or an organic insulating film made of, for example, BCB (BenzoCycloButene), acryl resin, epoxy resin, phenolic resin, polyamide resin, or polyimide resin. Embodiments of the present disclosure are not limited thereto.

A connection electrode 140 is disposed on the first planarization layer 14 so as to electrically connect the drain electrode 130D and an anode electrode 210 to each other via a contact-hole formed in the first planarization layer 14.

The connection electrode 140 may be made of at least one of silver (Ag), molybdenum (Mo), copper (Cu), titanium (Ti), aluminum (Al), chromium (Cr), nickel (Ni), neodymium (Nd), tungsten (W), and gold (Au). Alternatively, the connection electrode 140 may be composed of at least two or more layers including a first layer made of titanium (Ti), and a second layer made of at least one of molybdenum (Mo), copper (Cu), aluminum (Al), silver (Ag), chromium (Cr), gold (Au), neodymium (Nd), and nickel (Ni). However, the present disclosure is not limited thereto.

A second line 152 may be formed and disposed in the non-display area NA in the same process as a process of forming the connection electrode 140. The second line 152 may be connected to the first line 151 and thus may be used as an auxiliary electrode for transmitting a voltage to the cathode electrode 230.

A second planarization layer 15 may be disposed on the first planarization layer 14 and the connection electrode 140, and a portion of the second line 152. The second planarization layer 15 may be composed of an organic insulating film made of, for example, BCB (BenzoCycloButene), acryl resin, epoxy resin, phenolic resin, polyamide resin, or polyimide resin. Embodiments of the present disclosure are not limited thereto. The second planarization layer 15 may reduce a step caused by the lines and contact-holes formed thereunder.

The anode electrode 210, a light-emitting layer 220, and the cathode electrode 230 constituting the light-emitting element 2000 may be disposed on the second planarization layer 15 and in the display area AA.

The anode electrode 210 may be electrically connected to the drain electrode 130D of each of the driving transistors Tr_R, Tr_G, and Tr_B via the connection electrode 140.

The anode electrode 210 may be made of at least one or more of silver (Ag), aluminum (Al), gold (Au), molybdenum (Mo), tungsten (W), chromium (Cr), palladium (Pd), copper (Cu), an alloy thereof, indium tin oxide (ITO), indium zinc oxide (IZO). However, embodiments of the present disclosure are not limited thereto.

A third line 153 may be disposed in the non-display area NA and may be formed in the same process as a process of forming the anode electrode 210.

The third line 153 may be connected to the second line 152 and the first line 151 and thus may be used as an auxiliary electrode for transmitting a voltage to the cathode electrode 230. Depending on a design, the second line 152 or the third line 153 may be omitted, and the cathode electrode 230 may be directly connected to the first line 151.

A bank 21 may be disposed on a portion of the anode electrode 210 and a portion of the third line 153.

The bank 21 may distinguish a plurality of sub-pixels from each other, minimize light blurring, and prevent color mixing occurring at various viewing angles. The bank 21 may not cover a portion of the anode electrode 210 corresponding to a light-emissive area so as to be exposed and may overlap an end portion of the anode electrode 210. Further, the bank 21 may overlap the driving transistor and the connection electrode.

The bank 21 may be made of an inorganic insulating material such as silicon nitride (SiNx) or silicon oxide (SiOx), or may be made of at least one organic insulating material among BCB (BenzoCycloButene), acryl resin, epoxy resin, phenolic resin, polyamide resin, and polyimide resin. Alternatively, the bank 21 may be embodied as a black bank in which a black pigment is added to the organic insulating material to reduce light reflection. However, the present disclosure is not limited thereto.

A spacer 22 may be further disposed on the bank 21. The spacer 22 protrudes from the bank 21. The spacer 22 may support a fine metal mask (FMM) in depositing the organic light-emitting layer in the light-emitting area to prevent the bank 21 from being damaged by the fine metal mask. The spacer 22 may serve to prevent the organic light-emitting layer from being damaged by an external physical force during a subsequent manufacturing process or during use of the display device. The spacer 220 may be made of the same material as that of the bank 21, and the spacer 220 and the bank 21 may be formed simultaneously. However, the present disclosure is not limited thereto.

The light-emitting layer 220 may be disposed in an opening of the bank 21 exposing the portion of the anode electrode 210. The light-emitting layer 220 may include at least one light-emitting layer which may be made of an inorganic or organic material, and may be selected from a red light-emitting layer, a green light-emitting layer, a blue light-emitting layer, and a white light-emitting layer in order to emit light of a specific color.

When the light-emitting layer 220 includes only the white light-emitting layer, the light-emitting layer 220 may be disposed in the opening of the bank 21 and over an entire surface of the substrate.

The light-emitting layer 220 may include not only the at least one light-emitting layer, but also a hole injection layer, a hole transport layer, an electron transport layer, and an electron injection layer. However, the present disclosure is not limited thereto.

The cathode electrode 230 may be disposed on the light-emitting layer 220. The cathode electrode 230 supplies electrons to the light-emitting layer 220 and may be made of a conductive material having a low work function.

When the display device is of a top emission type, the cathode electrode 230 may be made of a transparent conductive material through which light transmits. For example, the transparent conductive material may include indium tin oxide (ITO), and indium zinc oxide (IZO). However, the present disclosure is not limited thereto.

Alternatively, the cathode electrode 230 may be made of a semi-transmissive conductive material that transmits light therethrough. For example, the cathode electrode 230 may be made of at least one or more of LiF/Al, CsF/Al, Mg:Ag, Ca/Ag, Ca:Ag, LiF/Mg:Ag, LiF/Ca/Ag, and LiF/Ca:Ag. However, the present disclosure is not limited thereto.

In the non-display area NA of the display device, a driver circuit area (not shown) and a dam area 160 in which a plurality of dams are disposed are disposed. In the non-display area NA of the display device, various power lines, and signal lines may be disposed.

The gate insulating film 12 and the interlayer insulating film 13 disposed on the substrate 11 may extend into the non-display area NA.

The plurality of dams may be disposed in the dam area 160 of the non-display area NA. In order to prevent leakage of a second encapsulation layer 320 of the encapsulation layer 3000 (which will be described below in detail) made of the organic material, each of the plurality of dams may have a stack structure in which at least one insulating layer may be stacked. However, embodiments of the present disclosure are not limited thereto.

The plurality of dams may include a first dam 161, a second dam 162, and a third dam 163 which may have a first height, a second height, and a third height, respectively, and may surround the display area AA.

The second height may be larger than the first height, and the third height may be smaller than the second height.

Even when the second encapsulation layer 320 flows over the first dam 161, the second dam 162 may block the second encapsulation layer 320.

Each of the first dam 161, the second dam 162, and the third dam 163 may be composed of a stack of at least two of a portion of the first planarization layer 14, a portion of the second planarization layer 15, a portion of the bank 21, and a portion of the spacer 22.

Each of the first line 151 and the second line 152 may be disposed under the portion of the second planarization layer 15 constituting the first dam 161.

The second line 152 may be disposed on top of the first line 151 and may extend into between the portion of the first planarization layer 14 constituting the second dam 162 and the portion of the second planarization layer 15 constituting the second dam 162.

The third line 153 may be disposed on top of the second line 152 and may be disposed on the portion of the bank 21 constituting the first dam 161. The third line 153 may extend into between the portion of the bank 21 constituting the second dam 162 and the portion of the second planarization layer 15 constituting the second dam 162.

The first line 151, the second line 152, and the third line 153 may contact and be electrically connected to each other in an area in which the first dam 161 and the second dam 162 are disposed and thus may transmit a voltage to the cathode electrode 230.

A capping layer (not shown) may be disposed on the cathode electrode 230. The capping layer is composed of an organic or inorganic film that protects the cathode electrode 230 and improves external light efficiency.

The encapsulation layer 3000 may be disposed on the cathode electrode 230 and the capping layer. The encapsulation layer 3000 may protect the display device 10 from external moisture, oxygen, or foreign matter. For example, the encapsulation layer 3000 may prevent penetration of oxygen and moisture from the outside into a light-emitting material and an electrode material in order to prevent oxidation of the light-emitting material and the electrode material.

The encapsulation layer 3000 may be made of a transparent material so that light emitted from the light-emitting layer 220 transmits therethrough.

The encapsulation layer 3000 may include a first encapsulation layer 310, the second encapsulation layer 320, and a third encapsulation layer 330 so as to prevent penetration of moisture or oxygen into the light-emitting material and the electrode material. However, embodiments of the present disclosure are not limited thereto.

The first encapsulation layer 310, the second encapsulation layer 320, and the third encapsulation layer 330 may be sequentially stacked. However, embodiments of the present disclosure are not limited thereto.

Each of the first encapsulation layer 310 and the third encapsulation layer 330 may be made of at least one inorganic material selected from among silicon nitride (SiNx), silicon oxide (SiOx), and aluminum oxide (AlyOz). However, the present disclosure is not limited thereto.

The second encapsulation layer 320 may cover foreign substances or particles that may occur in the manufacturing process. Further, the second encapsulation layer 320 may planarize a surface of the first encapsulation layer 310.

The second encapsulation layer 320 may be made of an organic material, for example, silicon oxycarbon (SiOC), epoxy, polyimide, polyethylene, or acrylate-based polymer. However, the present disclosure is not limited thereto.

The touch portion 4000 for a touch operation of the display device 10 may be disposed on the third encapsulation layer 330.

The touch portion 4000 may include a touch buffer layer 41, a touch bridge electrode 410, a touch insulating layer 42, and the touch electrode 420.

The touch buffer layer 41 may be disposed on the third encapsulation layer 330. The touch buffer layer 41 may improve adhesion between layers formed on the touch buffer layer 41 and the third encapsulation layer 330.

The touch buffer layer 41 may be composed of a single layer of silicon nitride (SiNx) or silicon oxide (SiOx) or a stack of multiple layers made thereof. However, the present disclosure is not limited thereto.

The touch buffer layer 41 may extend into the non-display area NA and to an area where a pad of the substrate 11 to which a flexible PCB (FPCB) is connected is disposed.

The touch bridge electrode 410 may be disposed on the touch buffer layer 41. The touch bridge electrode 410 may electrically connect the touch electrodes 420 to each other and may transmit a touch signal.

The touch bridge electrode 410 may be composed of a single layer or a stack of multiple layers made of one of silver (Ag), molybdenum (Mo), copper (Cu), titanium (Ti), aluminum (Al), chromium (Cr), nickel (Ni), neodymium (Nd), tungsten (W), and gold (Au) or an alloy thereof. However, the present disclosure is not limited thereto.

The touch insulating layer 42 may be disposed on the touch bridge electrode 410.

The touch insulating layer 42 may include a single layer made of silicon nitride (SiNx) or silicon oxide (SiOx) or a stack of multiple layers made thereof. However, the present disclosure is not limited thereto.

The touch electrode 420 may be disposed on the touch insulating layer 42. The touch electrode 420 may by connected to a plurality of touch lines disposed in the non-display area NA so as be connected to a touch circuit in the flexible PCB (FPCB). Each of the touch electrodes 420 spaced from each other may be connected to the touch bridge electrode 410 via a contact-hole formed in the touch insulating layer 42.

The touch circuit supplies a touch driving signal to the touch electrode 420 to drive a touch operation, detects a touch sensing signal from the touch electrode 420, and senses whether a touch occurs and/or a touch location coordinate based on the detected touch sensing signal.

The touch electrode 420 may be composed of a single layer or a stack of multiple layers made of one of silver (Ag), molybdenum (Mo), copper (Cu), titanium (Ti), aluminum (Al), chromium (Cr), nickel (Ni), neodymium (Nd), tungsten (W), and gold (Au) or alloys thereof. However, the present disclosure is not limited thereto.

The touch electrode 420 and the touch bridge electrode 410 may be disposed at a position corresponding to a position of the bank 21.

A touch planarization layer 43 may be formed on the touch electrode 420. The touch planarization layer 43 may be made of an inorganic insulating material such as silicon nitride (SiNx) or silicon oxide (SiOx), or at least one organic insulating material selected from BCB (benzocyclobutene), acryl resin, epoxy resin, phenolic resin, polyamide resin, and polyamide resin. However, the present disclosure is not limited thereto. The touch planarization layer 43 may extend into the non-display area NA and to an area where the pad of the substrate 11 to which the flexible PCB (FPCB) is connected is disposed.

The color filter portion 5000 may be disposed on the touch planarization layer 43. The color filter portion 5000 may include a color buffer layer 51, a plurality of color filters 520_R, 520_G, and 520_B, a black matrix 510, a low refractive index layer 530, and a color planarization layer 52.

The color buffer layer 51 may be disposed on the touch planarization layer 43. The color buffer layer 51 may be made of an inorganic insulating material such as silicon nitride (SiNx) or silicon oxide (SiOx), or at least one organic insulating material selected from BCB (benzocyclobutene), acryl resin, epoxy resin, phenolic resin, polyamide resin, and polyamide resin. However, the present disclosure is not limited thereto. The color buffer layer 51 may extend into the non-display area NA and to an area where the pad of the substrate 11 to which the flexible PCB (FPCB) is connected is disposed.

The plurality of color filters 520_R, 520_G, and 520_B corresponding to the plurality of sub-pixels and overlapping the plurality of light-emitting elements in the plurality of sub-pixels, respectively, and the black matrix 510 disposed therebetween may be disposed on the color buffer layer 51.

The plurality of color filters 520_R, 520_G, and 520_B may be formed in a corresponding manner to the plurality of sub-pixels. The black matrix 510 may be disposed between adjacent ones of the plurality of color filters 520_R, 520_G, and 520_B. Each of the plurality of color filters 520_R, 520_G, and 520_B may be disposed at positions corresponding to or vertically overlapping with the light-emissive area of each sub-pixel, and may cover an edge of the black matrix 510. The black matrix 510 may overlap with the bank 21.

A width of the bank 21 may be different from that of the black matrix 510. The width of the black matrix 510 may be smaller than that of the bank 21 to secure the wide viewing angle of the light emitted from the light-emitting layer 220 disposed in the opening of the bank 21.

The black matrix 510 may be disposed at a position corresponding to or vertically overlapping with the touch electrode 420. A width of the touch electrode 420 may be different from that of the black matrix 510. The width of the touch electrode 420 may be smaller than the width of the black matrix 510 so that the touch electrode 420 is not visible to a viewer outside of the display device 10.

The black matrix 510 may extend into the non-display area NA so as to cover the various power lines and the signal lines therein.

The low refractive index layer 530 may be disposed on the plurality of color filters 520_R, 520_G, and 520_B and the black matrix 510. The low refractive index layer may cover at least a portion of an upper surface of the black matrix 510 and at least a portion of an upper surface of the color filter. The low refractive index layer 530 may be separately disposed on each of the plurality of color filters 520_R, 520_G, and 520_B and the black matrix 510. The low refractive index layer 530 may include a first low refractive index layer 530*a* disposed on each of the plurality of color filters 520_R, 520_G, and 520_B, and a second low refractive index layer 530*b* disposed on the black matrix 510. The first low refractive index layer 530*a* and the second low refractive index layer 530*b* may be spaced apart from each other. The second low refractive index layer 530*b* together with the black matrix 510 may extend into the non-display area NA.

The low refractive index layer 530 may have a refractive index smaller than that of each of the plurality of color filters 520_R, 520_G, and 520_B and the black matrix 510. The first low refractive index layer 530*a* may have a refractive index smaller than that of each of the plurality of color filters 520_R, 520_G, and 520_B, and the second low refractive index layer 530*b* may have a refractive index smaller than that of the black matrix 510. Each of the first low refractive index layer 530*a* and the second low refractive index layer 530*b* may have a refractive index of 1.20 to 1.45. The first low refractive index layer 530*a* and the second low refractive index layer 530*b* may be made of the same material or different materials.

Each of the first low refractive index layer 530*a* and the second low refractive index layer 530*b* may be made of crystalline or amorphous fluoropolymer, fluorosilicone polymer, or fluorine-modified multifunctional acrylate.

Alternatively, each of the first low refractive index layer 530*a* and the second low refractive index layer 530*b* may include a matrix resin and at least one of hollow particles such as hollow silica, hollow alumina or magnesium fluoride ($MgF_2$) nanoparticles dispersed in the matrix resin. The matrix resin may be, for example, an acrylate-based resin.

For example, when each of the first low refractive index layer 530*a* and the second low refractive index layer 530*b* is made of the fluorine-modified multifunctional acrylate, each of the first low refractive index layer 530*a* and the second low refractive index layer 530*b* may be formed by mixing and stirring perfluoropolyether polyol, isocyanate-modified triacrylate, hydroquinone and dibutyltin dilaurate with each other to produce hexafunctional fluorine-modified acrylate, and mixing a photoinitiator and an ultraviolet stabilizer with the fluorine-modified acrylate to produce a resin composition, and coating and drying the resin composition, and curing the dried resin composition with ultraviolet light.

The color planarization layer 52 may be disposed on the plurality of color filters 520_R, 520_G, 520_B, the black matrix 510, and the low refractive index layer 530. The color planarization layer 52 may be made of an organic insulating material such as BCB (benzocyclobutene), acryl resin, epoxy resin, phenolic resin, polyamide resin, or polyimide resin. Embodiments of the present disclosure are not limited thereto. Each of the first low refractive index layer 530*a* and the second low refractive index layer 530*b* may have a refractive index smaller than that of the color planarization layer 52.

The color planarization layer 52 may extend so as to be disposed in the non-display area NA.

An adhesive layer 61 for attaching a cover window 62 to the color planarization layer 52 may be disposed on the color planarization layer 52. The adhesive layer 61 may be transparent and may be made of optical clear adhesive (OCA) or pressure-sensitive adhesive (PSA). In one embodiment, the adhesive layer 61 may be a gray adhesive layer having visible light transmittance of 72% to 79% to reduce external light reflection.

Figure 4:
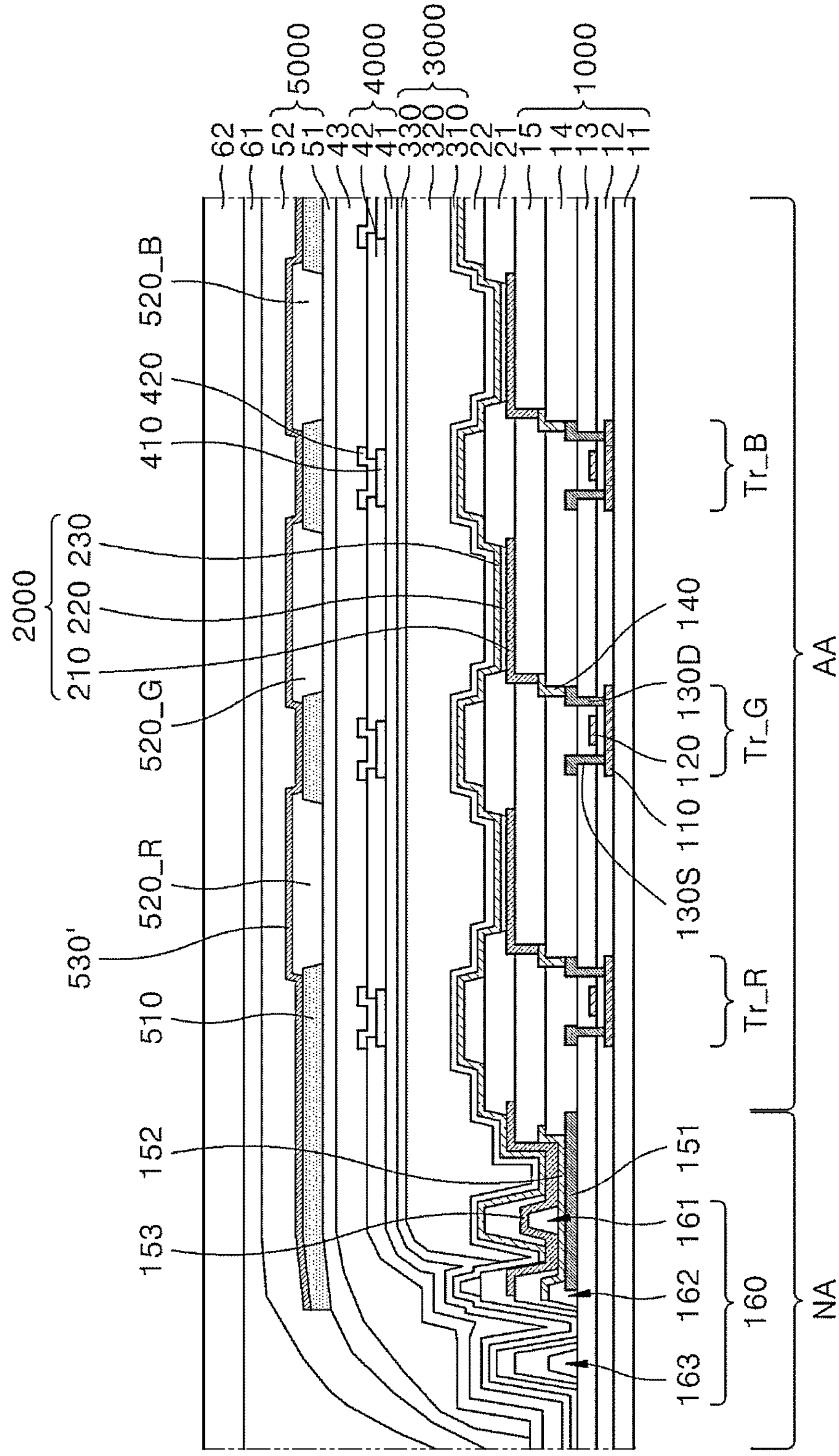

FIG. 4 is a cross-sectional view of a display device according to another embodiment of the present disclosure.

Referring to FIG. 4, the display device according to another embodiment of the present disclosure may include a low refractive index layer 530', unlike the low refractive index layer 530 of the display device as shown in FIG. 3.

The low refractive index layer 530' may be disposed on the plurality of color filters 520_R, 520_G, and 520_B and the black matrix 510. The low refractive index layer 530' may continuously extend while covering an entirety of the upper surfaces of the plurality of color filters 520_R, 520_G, and 520_B and an entirety of the upper surface of the black matrix 510. In other words, the first low refractive index layer and the second refractive layer as shown in FIG. 3 may be formed as a continuous layer. The low refractive index layer 530' may have a refractive index smaller than that of each of the plurality of color filters 520_R, 520_G, and 520_B and the black matrix 510. The low refractive index layer 530' may have a refractive index of 1.20 to 1.45.

The low refractive index layer 530' may be made of crystalline or amorphous fluoropolymer, fluorosilicone polymer or fluorine-modified polyfunctional acrylate.

Alternatively, the low refractive index layer 530' may include a matrix resin and at least one of hollow particles such as hollow silica, hollow alumina or magnesium fluoride ($MgF_2$) nanoparticles dispersed in the matrix resin. The matrix resin may be, for example, an acrylate-based resin.

For example, when the low refractive index layer 530' is made of the fluorine-modified multifunctional acrylate, the low refractive index layer 530' may be formed by mixing and stirring perfluoropolyether polyol, isocyanate-modified triacrylate, hydroquinone and dibutyltin dilaurate with each other to produce hexafunctional fluorine-modified acrylate, and mixing a photoinitiator and an ultraviolet stabilizer with the fluorine-modified acrylate to produce a resin composition, and coating and drying the resin composition, and curing the dried resin composition with ultraviolet light.

The color planarization layer 52 may be disposed on the plurality of color filters 520_R, 520_G, 520_B, the black matrix 510, and the low refractive index layer 530'. The low refractive index layer 530' may have a refractive index smaller than that of the color planarization layer 52.

A display device according to embodiments of the present disclosure may be described as follows.

A first aspect of the present disclosure provides a display device comprising: a substrate on which a display area and a non-display area are disposed; a light-emitting element disposed in a sub-pixel of the display area; an encapsulation layer covering the light-emitting element; a black matrix disposed on the encapsulation layer; a color filter overlapping the light-emitting element and covering an edge of the black matrix; and a low refractive index layer covering at least a portion of an upper surface of the black matrix and at least a portion of an upper surface of the color filter, wherein the low refractive index layer has a refractive index lower than a refractive index of each of the black matrix and the color filter.

In one implementation of the first aspect, the display device further comprises a color planarization layer covering the low refractive index layer, wherein the low refractive index layer has the refractive index lower than a refractive index of the color planarization layer.

In one implementation of the first aspect, the refractive index of the low refractive index layer is in a range of 1.20 to 1.45.

In one implementation of the first aspect, the low refractive index layer includes a first low refractive index layer disposed on the color filter, and a second low refractive index layer disposed on the black matrix, wherein the first low refractive index layer and the second refractive layer are spaced apart from each other.

In one implementation of the first aspect, the low refractive index layer continuously extends so as to cover an entirety of an upper surface of the black matrix and an entirety of an upper surface of the color filter.

In one implementation of the first aspect, the black matrix extends into the non-display area so as to cover lines disposed in the non-display area, wherein the low refractive index layer together with the black matrix extends into the non-display area.

In one implementation of the first aspect, the display device further comprises a touch electrode disposed on the encapsulation layer, wherein the black matrix is disposed at a position corresponding to or vertically overlapping with the touch electrode.

In one implementation of the first aspect, the width of the touch electrode is smaller than the width of the black matrix.

In one implementation of the first aspect, the low refractive index layer is made of crystalline or amorphous fluoropolymer, fluorosilicone polymer, or fluorine-modified multifunctional acrylate; or the low refractive index layer includes a matrix resin and at least one of hollow silica, hollow alumina and magnesium fluoride nanoparticles dispersed in the matrix resin.

A second aspect of the present disclosure provides a display device comprising: a substrate on which a display area and a non-display area are disposed; a plurality of light-emitting elements respectively disposed in a plurality of sub-pixels of the display area; an encapsulation layer disposed on the plurality of light-emitting elements; a plurality of color filters respectively overlapping the plurality of light-emitting elements and disposed on the encapsulation layer; a color planarization layer disposed on the plurality of color filters; and a first low refractive index layer disposed between each of the plurality of color filters and the color planarization layer, wherein the first low refractive index layer has a refractive index lower than a refractive index of each of the plurality of color filters and the color planarization layer.

In one implementation of the second aspect, the display device further comprises a black matrix disposed between adjacent ones of the plurality of color filters, wherein a second low refractive index layer is further disposed between the black matrix and the color planarization layer.

In one implementation of the second aspect, the second low refractive index layer has the refractive index lower than a refractive index of the black matrix.

In one implementation of the second aspect, the refractive index of each of the first and second low refractive index layers is in a range of 1.20 to 1.45.

In one implementation of the second aspect, the first low refractive index layer and the second refractive layer are spaced apart from each other; or the first low refractive index layer and the second refractive layer are formed as a continuous layer.

In one implementation of the second aspect, the black matrix extends into the non-display area so as to cover lines disposed in the non-display area, and the second low refractive index layer together with the black matrix extends into the non-display area.

In one implementation of the second aspect, each of the first and second low refractive index layers is made of crystalline or amorphous fluoropolymer, fluorosilicone polymer, or fluorine-modified multifunctional acrylate; or each of the first and second low refractive index layers includes a matrix resin and at least one of hollow silica, hollow alumina and magnesium fluoride nanoparticles dispersed in the matrix resin.

In one implementation of the second aspect, the display device further comprises a bank disposed on the substrate and distinguish the plurality of sub-pixels from each other, and the black matrix overlaps the bank with a smaller width than that of the bank.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display device, comprising:

a substrate on which a display area and a non-display area are disposed;

a light-emitting element disposed in a sub-pixel of the display area;

an encapsulation layer covering the light-emitting element;

a black matrix disposed on the encapsulation layer;

a color filter overlapping the light-emitting element and covering an edge of the black matrix; and a low refractive index layer covering at least a portion of an upper surface of the black matrix and at least a portion of an upper surface of the color filter, wherein the low refractive index layer has a refractive index lower than a refractive index of each of the black matrix and the color filter, wherein the low refractive index layer includes a first low refractive index layer disposed on the color filter, and a second low refractive index layer disposed on the black matrix, and wherein the first low refractive index layer and the second refractive layer are spaced apart from each other.

2. The display device of claim 1, wherein the display device further comprises a color planarization layer covering the low refractive index layer, wherein the low refractive index layer has the refractive index lower than a refractive index of the color planarization layer.

3. The display device of claim 1, wherein the refractive index of the low refractive index layer is in a range of 1.20 to 1.45.

4. The display device of claim 1, wherein the black matrix extends into the non-display area so as to cover lines disposed in the non-display area, wherein the low refractive index layer together with the black matrix extends into the non-display area.

5. The display device of claim 1, wherein the display device further comprises a touch electrode disposed on the encapsulation layer, wherein the black matrix is disposed at a position corresponding to or vertically overlapping with the touch electrode.

6. The display device of claim 5, wherein the width of the touch electrode is smaller than the width of the black matrix.

7. The display device of claim 1, wherein the low refractive index layer is made of crystalline or amorphous fluoropolymer, fluorosilicone polymer, or fluorine-modified multifunctional acrylate; or the low refractive index layer includes a matrix resin and at least one of hollow silica, hollow alumina and magnesium fluoride nanoparticles dispersed in the matrix resin.

* * * * *